United States Patent [19]
Stewart

[11] Patent Number: 4,527,081
[45] Date of Patent: Jul. 2, 1985

[54] OVERSHOOT PREDRIVEN SEMI-ASYNCHRONOUS DRIVER

[75] Inventor: Roger G. Stewart, Neshanic Station, N.J.

[73] Assignee: The United States of America as represented by the Scretary of the Army, Washington, D.C.

[21] Appl. No.: 465,851

[22] Filed: Feb. 11, 1983

[51] Int. Cl.³ .................. H03K 3/01; H03K 17/687
[52] U.S. Cl. .................................. 307/270; 307/571; 365/189; 365/181
[58] Field of Search ............. 307/270, 571, 300, 255, 307/254

[56] References Cited

U.S. PATENT DOCUMENTS

| 3,937,983 | 2/1976 | Reed | 307/270 |
| 4,242,738 | 12/1980 | Dingwall | 365/189 |
| 4,359,650 | 11/1982 | Newcomb | 307/270 |
| 4,421,994 | 12/1983 | Purl | 307/270 |

Primary Examiner—Stanley D. Miller
Assistant Examiner—B. P. Davis
Attorney, Agent, or Firm—Anthony T. Lane; Jeremiah G. Murray; Robert A. Maikis

[57] ABSTRACT

An output driver circuit for fast memories and microprocessors and the like. The driver circuit is responsive to a binary input voltage and includes first and second signal control paths respectively coupled to a pair of series connected output stage transistors coupled between two high and low reference voltages and switched alternately between conducting and non-conducting states in mutual opposition to provide a binary output voltage substantially equal to either of the two reference voltages depending upon the binary state of the input voltage. Additionally included is an anticipatory circuit having means responsive to both an externally applied precharge signal and a feedback signal corresponding to the binary state of the output voltage which alternately predrive the transistors close to their respective conducting switching points for increasing the speed of transition of the transistors between conductive and non-conductive states.

20 Claims, 2 Drawing Figures

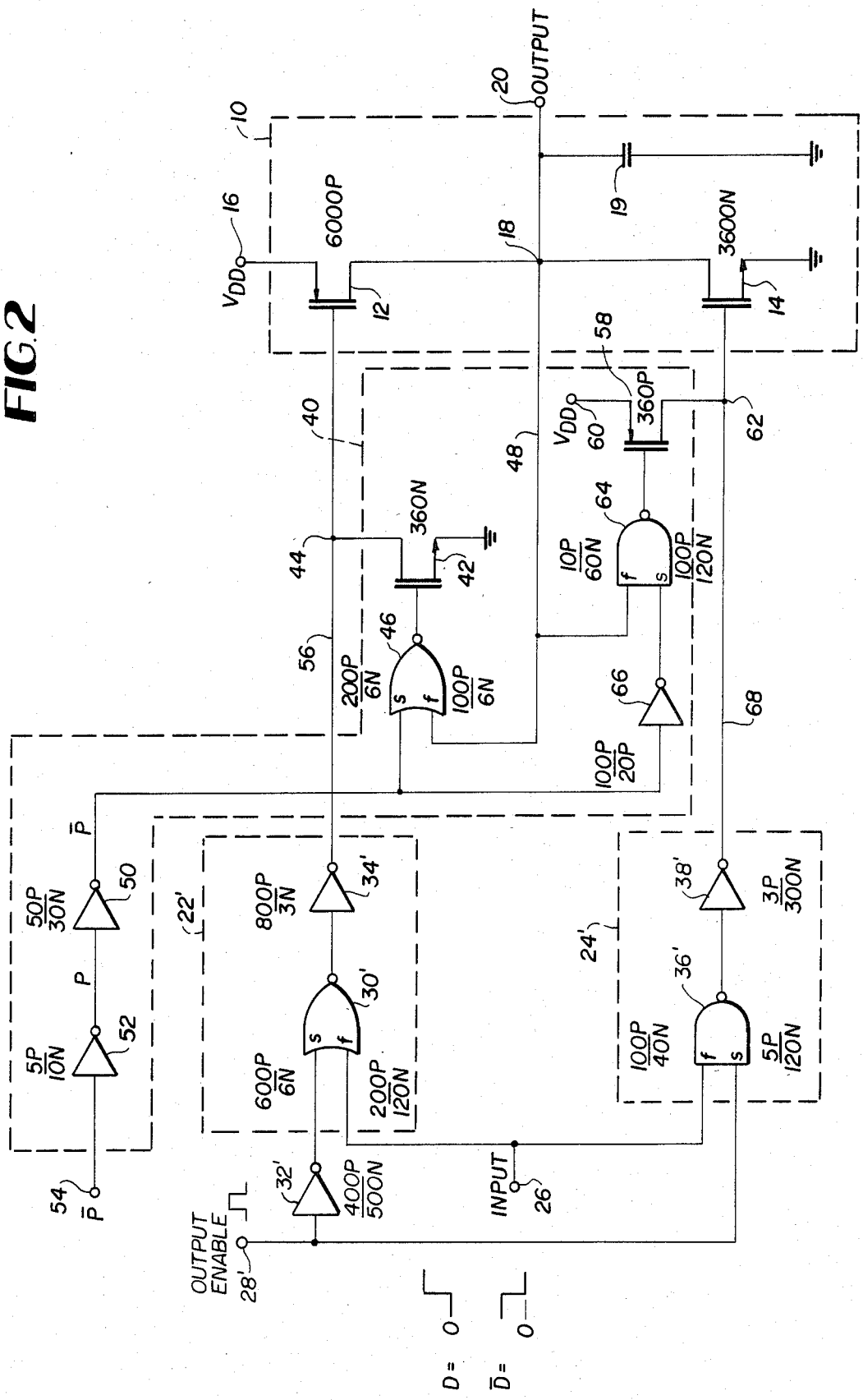

4,527,081

OVERSHOOT PREDRIVEN SEMI-ASYNCHRONOUS DRIVER

The government has rights in this invention pursuant to Contract No. DAAK20-79-C-0276 awarded by the Department of the Army.

FIELD OF THE INVENTION

This invention relates generally to high speed driver circuitry for the propagation of electrical signals to a load and more particularly to a means for increasing the speed of operation of such circuitry.

BACKGROUND OF THE INVENTION

High speed driver circuits are required not only for driving the outputs of fast memories and microprocessors and the like, but are increasingly needed for driving internal loads as well. Such drivers, while generally known, have recently undergone improvements for increasing their speed of operation. One such circuit is shown and described in U.S. Pat. No. 4,242,738, entitled, "Look Ahead High Speed Circuitry", issued to A. Dingwall on Dec. 30, 1980. There circuitry is disclosed in which first and second series connected output drive transistors clamp the circuit output to first and second points of operating potential in response to a data input signal of one of two binary values, respectively. Additionally, there is provided a look ahead precharge circuit which is adapted to set the circuit output to levels intermediate high and low levels in anticipation of the application of a data signal which when applied causes the output to be driven either to a high level or low level at a relatively faster time, thereby increasing the speed of transition between output levels corresponding to two binary values, i.e. "high" or "low". While this provides a major step forward in performance, power dissipation can be relatively high and the precharge and the data transitions must be accurately synchronized to achieve optimum performance.

SUMMARY OF THE INVENTION

Accordingly, it is an object of the invention to provide an improvement in circuitry for conditioning a circuit through which data signals are propagated.

Another object of the invention is to provide a means for increasing the speed of transition in a binary output signal driver.

A further object of the invention is to increase the transition speed of a binary signal driver while providing asynchronous operation.

These and other objects are achieved in accordance with an output driver circuit responsive to a binary input voltage level and including first and second signal control paths respectively coupled to a pair of series connected drive transistors coupled between two reference voltages, typically a supply voltage and ground, the drive transistors being switched alternately between conducting and non-conducting states in mutual opposition to provide an output signal substantially equal to either of the two reference voltages, depending upon the binary state of the input voltage and additionally including an anticipation circuit coupled to the drive transistors and having means responsive to a feedback voltage level corresponding to the binary state of the output signal as well as a look ahead precharge signal to alternately predrive the drive transistors close to their respective conducting switching point for increasing their switching speed between non-conducting and conducting states.

BRIEF DESCRIPTION OF THE DRAWINGS

FIG. 2 is an electrical schematic diagram illustrative of the preferred embodiment of the invention.

DESCRIPTION OF THE PREFERRED EMBODIMENT

Figure 1:
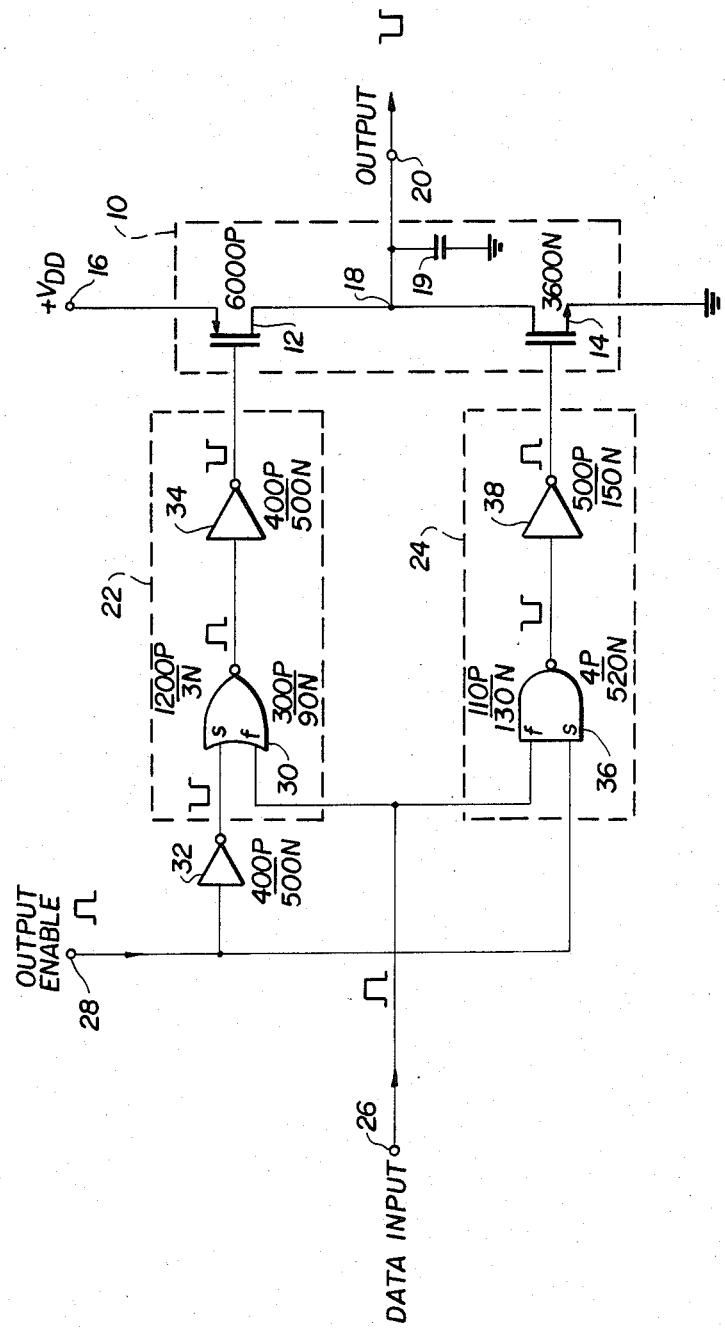
FIG. 1 is an electrical schematic diagram illustrative of a conventional high speed driver for providing a basic understanding of such circuitry.

The present invention is implemented by semiconductor devices which are well known in the art as insulated gate field effect transistors, hereinafter referred to as IGFETs. Each IGFET has first and second current conducting electrodes which define the extremities of a current conducting semiconductor region and a controlled electrode whose applied potential controls the conductivity in the conduction region. The two current conducting electrodes of an IGFET are referred to as the source and drain electrodes, respectively, while the control electrode is referred to as the gate. For a P type IGFET, the source electrode is defined as that one of the first and second electrodes having a relatively positive potential applied thereto, while for an N type IGFET, the source electrode is defined as that one of the first and second electrodes having a relatively less positive or negative potential applied thereto. Conduction occurs when the applied gate to source potential is in a direction to turn on the transistor i.e. become conductive and is greater in magnitude than a given threshold value. To turn on a P type enhancement IGFET, its gate voltage has to be more negative than its source voltage. To turn on an N type enhancement IGFET, its gate voltage must be more positive than the source voltage. It should also be pointed out that IGFETs are bi-directional in a sense that when an enabling signal is applied to the gate electrode, current conduction flows in either direction in the region intermediate the source and drain electrodes.

In the detailed description which follows, a potential level at or near ground potential is defined as a binary 0 or "low" value and any potential level at or substantially near the positive supply potential $+V_{dd}$ is defined as a binary 1 or "high" value.

Referring now to FIG. 1, there is disclosed a basic form of a typical prior art driver circuit which forms a part of the subject invention and which includes an output stage 10 comprised of a P type IGFET 12 and an N type IGFET 14 coupled in series by their respective drain and source electrodes between a terminal 16 to which is applied the positive supply potential $+V_{dd}$ and ground. A circuit node 18 between the drain electrodes is coupled to an output terminal 20 for providing a binary output signal across a load capacitor 19 of a "high" value when IGFET 12 is conducting and IGFET 14 is non-conducting and a "low" value when IGFET 12 is non-conducting and IGFET 14 is conducting.

The IGFETs 12 and 14 of the output stage 10 are controlled by first and second signal control paths 22 and 24 which operate in accordance with a binary "high" or "low" input data signal applied to a data input terminal 26 and a binary enabling signal applied to terminal 28.

The first control path 22 is comprised of a two input NOR gate 30, one input (f) of which is coupled to the data input terminal 26 while its other input (s) is coupled to the enabling signal terminal 28 through an inverter 32. The output of the NOR gate 30 is coupled to the gate of IGFET 12 by means of a second inverter 34. The second signal control path 24, on the other hand, is comprised of a two input NAND gate 36 having one of its inputs (f) coupled to the data input terminal 26 while its other input (s) is directly coupled to the enabling signal terminal 28. The output of the NAND gate 36 is coupled to the gate electrode of IGFET 14 by means of an inverter 38.

The inverters 32, 34 and 38 are typically comprised of well-known complementary converters such as illustrated in the above-mentioned U.S. Pat. No. 4,242,738, entitled, "Look Ahead High Speed Circuitry". Accordingly, each inverter is comprised of an IGFET of P type conductivity having its source and drain electrodes connected in series with the source and drain electrodes of an IGFET of N type conductivity between a supply potential $+V_{dd}$ and ground. The gate electrodes of the two IGFETs are connected in common to the inverter input and the drain electrodes of the two IGFETs are connected in common to the inverter output.

The shape of the transfer curve and hence the switching point of such a complementary inverter is dependent, among other things, on the characteristics and impedances of the N and P transistors forming the inverters. The impedance of each transistor, in turn, is a function of the ratio of its channel length and width. The switching point of the inverters accordingly are controlled by proper selection and design of the width to length ratios of the IGFETs forming the inverters. This assumes that the other parameters such as threshold voltages, oxide thicknesses, doping levels, etc. remain the same. Accordingly, by making the P type IGFETs smaller than the N type IGFETs, the switching point of the inverter is set close to ground while conversely making the P type IGFETs larger than the N type IGFETs, the switching point is set closer to $V_{dd}$. The relative sizes of the P and N IGFETs are illustrated in FIG. 1 by the integer values of the respective P/N ratios.

Thus a positive going signal at the input of inverter 34 causes the ground side N type IGFET to go "low" quickly, while a negative going signal having the same slope will take relatively longer time to reach the same switching point. Also once the switching point is reached, it takes longer for the P type device, since it is a small device, to charge its output capacitance than it takes the N IGFET to discharge this capacitance to ground. Hence, the output voltage of inverter 34, for example, will rise towards the "high" level relatively slowly compared to the faster falling low going level. Where the P type device is made larger than the N type device, as indicated with respect to inverter 38, the switching point of inverter 38 is set closer to $+V_{dd}$ so that the inverter output goes "high" relatively quickly and "low" relatively slowly.

With respect to the NOR gate 30, it is preferably comprised of a well known two input f (fast) and s (slow) complementary NOR gate comprised of two P type transistors connected in series between $+V_{dd}$ and the gate output and two N type transistors connected in parallel between the gate output and ground. The (f) input is indicative of the input terminal coupled to the serial transistor connected to the output while the (s) input is indicative of the relatively slow transistor connected to a power rail. The P type transistors of NOR gate 30 are relatively larger than the N type transistors as indicated by the P/N ratios at FIG. 1. Accordingly, the switching point of NOR gate 30 is set close to $+V_{dd}$ so that its output goes "high" quickly and "low" relatively slowly. With respect to the NAND gate 36, it is preferably comprised of a two input complementary NAND gate, also well known, comprised of two P type transistors connected in parallel between $+V_{dd}$ and the gate output, and two N type transistors, connected in series between the gate output and ground. As shown in FIG. 1, the N transistors, as indicated by the P/N ratios, are relatively larger than the P type transistors and therefore the switching point of the NAND gate 36 is set close to ground potential, so that its output goes "low" quickly and "high" slowly.

In operation, when the signal level at the data input terminal 26 is "low" indicative of a "not data" signal $\overline{DATA}$ and the enabling signal applied to terminal 28 is "high", the two inputs of the NOR gate 30 will be "low", however its output will be "high" in accordance with the well known function of a NOR gate. This signal is inverted by the inverter 34 and applied as a "low" signal to the gate of the output drive transistors 12 causing it to become conductive. This in turn causes circuit node 18 and the output terminal 20 to go "high" i.e. to $+V_{dd}$. Simultaneously the output of the NAND gate 36 goes "high" because both inputs are "low" and the inverter 38 provides a low going signal to the gate of output transistor 14 which is rendered non-conductive. On the other hand, when a "high" DATA signal is applied to input terminal 26 along with a "high" output enabling signal to terminal 28, the output of the inverter 32 goes "low" but due to the "high" level at the (f) input of NOR gate 30, its output goes "low". The inverter 34 provides a high going output signal which is applied to the gate of output transistor 12 which is driven non-conductive thereby. At the same time, the output transistor 14 is rendered conductive by the low going output of NAND gate 36 which is inverted by the inverter 38, causing a "high" signal to be applied to the gate of transistor 14. When the output transistor 14 becomes conductive, the circuit node 18 and accordingly the output signal level at output terminal 20 is pulled to ground and accordingly goes "low". This operation is conventional and well known to those skilled in the art.

Bearing the foregoing in mind, reference is now made to FIG. 2, wherein there is disclosed the preferred embodiment of the invention which includes not only an output stage 10, but also first and second data signal control paths 22' and 24', and wherein the (s) input of NOR gate 30' is connected to the output enable terminal 28' via inverter 32' while the (s) input of NAND gate 36' is directly connected to terminal 28'. Additionally, however, there is now included an anticipation or predriver circuit 40 which is comprised of, inter alia, an N type transistor 42 whose drain and source electrodes are respectively connected to circuit node 44 and ground. The gate of the FET transistor 42 is connected to the output of a two input NOR circuit 46 which has its fast (f) input connected to feedback signal path 48 connected to the output node 18. The slow (s) input of the NOR gate 46 is connected to the output of a relatively fast high going inverter 50 whose input is coupled to the output of a relatively fast low going inverter 52 as indicated by the respective P/N ratios. The input of the inverter 52 is connected to a terminal 54 which is adapted to receive an externally applied look ahead or precharge signal P or P̄. It can be seen by reference to FIG. 2 that the IGFET transistor 42 comprises a transistor whose conductive state will affect the signal level at circuit node 44 as well as the circuit lead 56 connecting the first signal control path 22' to the gate of the output transistor 12. The circuit 40 also includes P type IGFET transistor 58 whose source and drain electrodes are respectively coupled between the $+V_{dd}$ supply terminal 60 and circuit node 62. The gate of the transistor 58 is connected to the output of a two input NAND gate 64 whose fast (f) input is connected to the feedback signal path 48 and whose slow (s) input is connected to the output of a relatively fast high going inverter 66 whose input is coupled to the output of the inverter 50. In a manner similar to that of transistor 42, the conductive state of transistor 58 affects the signal level at circuit node 62 and on the circuit lead 68 connecting the second control signal path 24' to the gate of output transistor 14.

With respect to the two signal control paths 22' and 24', they differ slightly with respect to the two data signal control paths 22 and 24 shown in FIG. 1 in that the first signal control path 22' of FIG. 2 includes an inverter 34' which is comprised of an inverter having P type transistors which are relatively large in comparison to the N type transistors, thus making it an inverter which operates to go "high" quickly while going "low" relatively slowly. The NOR gate 30' is like the NOR gate 30. As before, the fast (f) input is coupled to the data signal input terminal 26 while its slow (s) input is coupled to the output of inverter 32'. As to the second signal control path 24', it is comprised of an inverter 38' comprised of P type transistors which are relatively small in comparison to the N type transistors, thus rendering the inverter a circuit which goes "low" quickly but "high" relatively slowly. The NAND gate 36' is similar to the NAND gate 36 with the exception that it is comprised of a relatively large and small P type transistor and a relatively small and a relatively large N type transistor as evidenced by the P/N ratios shown. As before, the fast input (f) is coupled to the data signal input terminal 26 while its slow (s) input is coupled to the output enable terminal 28'.

Operation of the circuit shown in FIG. 2 is as follows. Assuming, for example, that the data input signal applied to input terminal 26 is "high", the output level at output terminal 20 will be "low" due to the fact that two "high" inputs appear at the NAND gate 36' which outputs a "low" signal. However, the inverter 38' couples a high going signal to the gate of transistor 14, causing it to become conductive and pull circuit node 18 down to ground potential. Simultaneously, the "high" input signal is applied to the (f) input terminal of the NOR gate 30', whose output goes "low". But due to the presence of the inverter 34', the gate of transistor 12 is driven high, causing the transistor to be or remain non-conductive. Such action occurs in absence of a precharge signal P̄ appearing at terminal 54.

When a P̄ signal is applied, however, it is twice inverted and applied as a P̄ or "low" signal to the (s) input to the NOR gate 46, which provides a high going output which is applied to the gate of N type transistor 42, which becomes conductive and accordingly tries to pull circuit node 44 to ground potential due to the fact that its source electrode is connected to ground. However, as long as the input signal DATA remains "high", the conductive transistor 42 is opposed by the inverter 34' which, as noted before, goes low relatively slowly. This causes the voltage level on circuit lead 56 and node 44 to settle to an intermediate level close to the threshold or turn-on point of the non-conducting output transistor 12. The output terminal 20, meanwhile, remains "low" and virtually at ground potential since output transistor 14 is fully conductive.

However, as soon as the data signal applied to the data input terminal 26 switches from "high" to "low", the output of the NOR gate 30' goes "high" which reduces the current through the inverter 34' sufficiently to allow transistor 42 to discharge node 44 to ground and thus turn on the output transistor 12 which was already on the verge of conduction. The conduction of transistor 12 starts to pull circuit node 18 to supply voltage $+V_{dd}$ and thus make the output terminal go "high". This must be accompanied by a rapid turn off of transistor 14, however. This is provided by the output of inverter 38', which due to its small P/N ratio, goes "low" extremely fast in response to a high going output from the NAND gate 36' as its (f) input goes "low". Once the output has responded and circuit node 18 goes "high", the feedback signal path 48 couples a "high" signal to the (f) inputs of both the NOR gate 46 and NAND gate 64. The output of the NOR gate 46 is driven "low" which renders transistor 42 non-conducting. However, the output of the NAND gate 64 goes "low" which drives transistor 58 into conduction causing the supply potential $+V_{dd}$ to be applied to circuit node 62, which in turn operates in conjunction with the inverter 38' to bring the voltage level at node 62 and at the gate of transistor 14 close to the conduction point of transistor 14 in the same manner as described with respect to the other output transistor 12. Circuit node 62 in effect starts at the voltage $+V_{dd}$ and overshoots all the way to ground to turn off transistor 14 and thus expedite the low to high transition of the output signal appearing at output terminal 20 and then rapidly returns to an intermediate level as transistor 58 turns on in preparation for a fast reverse transition.

Having thus shown and described what is at present considered to be the preferred embodiment of the invention, it should be noted that the foregoing detailed description has been made by way of illustration and not limitation. Accordingly, all modifications, alterations and changes coming within the spirit and scope of the invention as defined in the appended claims are herein meant to be included.

I claim:

1. A high speed signal propagation circuit, comprising:

an output terminal;

an output stage coupled to said output terminal and including a first and second semiconductor device, each having a pair of current conducting electrodes defining a current path and a control electrode for controlling the current in said current path, coupled together by means of their current conducting electrodes between first and second reference voltages and being rendered alternately conducting and non-conducting in mutual opposition to provide a multi-level output signal at said output terminal;

an input terminal;

a first signal control path coupled between said input terminal and the control electrode of the first semiconductor device of said output stage and being operable to control the conductive state of the first semiconductor device in response to an input signal applied to said input terminal;

a second signal control path coupled between said input terminal and the control electrode of the second semiconductor device of said output stage and being operable to control the conductive state of the second semiconductor device in response to said input signal; and anticipatory circuit means coupled to the control electrode of both of said semiconductor devices and including feedback circuit means coupled to said output terminal and generating a feedback signal from said output signal for setting the voltage level at the control electrode of the non-conducting semiconductor device of said first and second semiconductor device at a point somewhat less than the point of conduction of the non-conducting device in response to the level of said feedback signal for enhancing the speed of transition between non-conducting and conducting states of said semiconductor devices.

2. The signal propagation circuit as defined by claim 1 wherein said anticipatory circuit means additionally includes look ahead circuit means generating a look ahead control signal for enhancing said speed of transition between non-conducting and conducting states.

3. The signal propagation circuit as defined by claim 2 wherein said first and second signal control paths comprises binary signal control paths.

4. The binary signal propagation circuit as defined by claim 3 wherein said first binary signal control path includes a first signal inverter having an output coupled to the control electrode of said first semiconductor device, wherein said second binary signal control path includes a second signal inverter having an output coupled to the control electrode of said second semiconductor device, and wherein said first signal inverter is operable to provide a signal at said output thereof which changes relatively quickly in the direction of said first reference potential and relatively slowly in the direction of said second reference potential, and said second signal inverter is operable to provide a signal at said output thereof which changes relatively quickly in the direction of said second reference potential and relatively slowly in the direction of said first reference potential.

5. The binary signal propagation circuit as defined by claim 3 wherein said first and second semiconductor devices are comprised of first and second transistors of mutually opposite conductivity type.

6. The binary signal propagation circuit as defined by claim 3 wherein said first and second transistors have their current conducting electrodes connected in series between said first and said second reference voltage.

7. The binary signal propagation circuit as defined by claim 6 wherein said output terminal is connected to the interconnection between one current electrode of said first transistor and one current electrode of said second transistor.

8. The binary signal propagation circuit as defined by claim 7 wherein said first transistor comprises a P type transistor and said second transistor comprises an N type transistor.

9. A high speed signal propagation circuit, comprising:

an output terminal;

an output stage coupled to said output terminal and including a first and second semiconductor device, each having a pair of current conducting electrodes defining a current path and a control electrode for controlling the current in said current path, coupled together by means of their current conducting electrodes between first and second reference voltages and being rendered alternately conducting and non-conducting in mutual opposition to provide a multi-level output signal at said output terminal;

an input terminal;

a first binary signal control path coupled between said input terminal and the control electrode of the first semiconductor device of said output stage and being operable to control the conductive state of the first semiconductor device in response to an input signal applied to said input terminal;

a second binary signal control path coupled between said input terminal and the control electrode of the second semiconductor device of said output stage and being operable to control the conductive stage of the second semiconductor device in response to said input signal; and anticipatory circuit means coupled to the control electrode of both said semiconductor devices and including feedback circuit means coupled to said output terminal and generating a feedback signal from said output signal for setting the voltage level at the control electrode of the non-conducting semiconductor device of said first and second semiconductor device at a point relatively near the point of conduction of the non-conducting device in response to the level of said feedback signal for enhancing the speed of transition between non-conducting and conducting states of said semiconductor devices and look ahead circuit means generating a look ahead control signal for further enhancing said speed of transition between non-conducting and conducting states, said anticipatory circuit means comprising a third and fourth semiconductor device, each having a pair of current conducting electrodes defining a current path and a control electrode for controlling the current in said path, said pair of current conducting electrodes of said third semiconductor device being connected between the control electrode of said first semiconductor device and a selected one of said first and second reference voltages, said pair of current conducting electrodes of said fourth semiconductor device being connected between the control electrode of said second semiconductor device and the other of said first and second reference voltages, a first dual input logic gate having an output coupled to the control electrode of said third semiconductor device and having one of said dual inputs coupled to said look ahead control signal and the other of said dual inputs to said feedback signal, and a second dual input logic gate having an output coupled to the control electrode of said fourth semiconductor device, and having one of said dual inputs coupled to said look ahead control signal and the other of said dual inputs to said feedback signal.

10. The binary signal propagation circuit as defined by claim 9 wherein said third and fourth semiconductor devices comprise a pair of mutually opposite conductivity type transistors.

11. The binary signal propagation circuit as defined by claim 10 wherein said first and fourth transistors are of a first conductivity type and said second and third transistors are of a second conductivity type.

12. The signal propagation circuit as defined by claim 11 wherein all of said transistors are comprised of IGFETs.

13. The binary signal propagation circuit as defined by claim 11 wherein said first logic gate comprises a gate of a first logic type and said second logic gate comprises a gate of a second logic type.

14. The binary signal propagation circuit as defined by claim 13 wherein said first transistor conductivity type comprises P type conductivity and said second transistor conductivity type comprises N type conductivity, and wherein said first logic gate comprises a NOR type logic gate and said second logic gate comprises a NAND type logic gate, and additionally including signal inverter means coupled between the look ahead control signal and said one dual input of said NAND gate.

15. The binary signal propagation circuit as defined by claim 9 wherein said first signal control path includes a first signal inverter having an output coupled to the control electrode of said first semiconductor device, wherein said second control path includes a second signal inverter having an output coupled to the control electrode of said second semiconductor device, a wherein said first signal inverter is operable to provide a signal at said output thereof which changes relatively quickly in the direction of said first reference potential and relatively slowly in the direction of said second reference potential, and said second signal inverter is operable to provide a signal at said output signal thereof which changes relatively quickly in the direction of said second reference potential and relatively slowly in the direction of said first reference potential.

16. The signal propagation circuit as defined by claim 15 wherein said first and second inverters comprise complementary type signal inverters, and being respectively comprised of one transistor of said first conductivity type and another transistor of said second conductivity type.

17. The signal propagation circuit as defined by claim 16 wherein said first conductivity type comprises P type conductivity and said second conductivity type comprises N type conductivity, and wherein the P type conductivity transistor of said first inverter is larger than the N type conductivity transistor, and wherein the P type conductivity transistor of said second inverter is smaller than the N type conductivity transistors.

18. The signal propagation circuit as defined by claim 15 wherein said first signal control path additionally includes a first type dual input logic gate having an output coupled to said first signal inverter, and having one of said dual inputs coupled to said input terminal and the other of said dual inputs coupled to a control input, and wherein said second signal control path additionally includes a second type dual input logic gate having an output coupled to said second signal inverter, and having one of said dual inputs coupled to said input terminal and the other of said dual inputs is also coupled to a control input.

19. The signal propagation circuit as defined by claim 18 wherein said first type logic gate comprises a NOR gate and said second type logic gate comprises a NAND gate.

20. The binary signal propagation circuit as defined by claim 9 wherein said anticipatory circuit means additionally includes a pair of complementary signal inverters coupled in series between said look ahead control signal and said other inputs of said first and second dual input logic gates, and wherein one of said pair of inverters includes a P type conductivity transistor which is relatively larger than the N type conductivity transistor and wherein the other of said pair of inverters includes a P type conductivity transistor which is relatively smaller than the N type conductivity type transistor.

* * * * *

UNITED STATES PATENT AND TRADEMARK OFFICE
CERTIFICATE OF CORRECTION

PATENT NO. : 4,527,081

DATED : July 2, 1985

INVENTOR(S) : ROGER G. STEWART

It is certified that error appears in the above-identified patent and that said Letters Patent are hereby corrected as shown below:

Column 8, line 22, "stage" should read ---state---.

Signed and Sealed this

Twenty-second Day of October 1985

[SEAL]

Attest:

DONALD J. QUIGG

Attesting Officer

Commissioner of Patents and Trademarks—Designate